United States Patent [19]

Oda et al.

[11] 4,159,508
[45] Jun. 26, 1979

[54] MULTILAYER PRINTED WIRING BOARD

[75] Inventors: Masahiro Oda, Kawasaki; Mikio Nishihara, Yokohama, both of Japan

[73] Assignee: Fujitsu Limited, Japan

[21] Appl. No.: 750,818

[22] Filed: Dec. 15, 1976

[30] Foreign Application Priority Data

Dec. 22, 1975 [JP] Japan .................................. 50/171835

[51] Int. Cl.² .............................................. H05K 1/04
[52] U.S. Cl. ..................................... 361/410; 361/414
[58] Field of Search .............................. 361/414, 410

[56] References Cited

U.S. PATENT DOCUMENTS

| | | | |
|---|---|---|---|
| 3,691,290 | 9/1972 | Napier | 361/411 |
| 3,898,370 | 8/1975 | Davy | 361/414 |
| 3,923,359 | 12/1975 | Newsam | 361/414 |

*Primary Examiner*—David Smith, Jr.
*Attorney, Agent, or Firm*—Staas & Halsey

[57] ABSTRACT

This application discloses a multilayer printed wiring board having a plurality of pattern layers. Said printed wiring board has at least one pair of plated through holes, i.e. a first and a second plated through hole. The first plated through hole is directly connected to said patterns. The second plated through hole is not directly connected to said patterns. An electronic element terminal is connected to said second plated through hole. The first and second plated through holes are electrically connected to each other on a surface opposite an element mounting surface of the printed wiring board.

1 Claim, 6 Drawing Figures

MULTILAYER PRINTED WIRING BOARD

BACKGROUND OF THE INVENTION

The present invention relates to a multilayer printed wiring board having a plurality of wiring pattern layers and many plated through holes for mounting electronic elements, such as LSI (large scale integrated circuits), IC (integrated circuits) or transistors.

The wiring patterns of a multilayer printed wiring board are sometimes required to be changed after electronic elements are mounted on the printed wiring board. In a multilayer printed wiring board according to the prior art, if it is necessary to cut the electrical connection between a terminal of an electronic element on the board and the patterns, the cutting operation is achieved by removing the elements from the board and then cutting the wiring patterns or breaking the plated through hole into which the terminal is inserted by drilling.

FIG. 1 is a sectional view of a multilayer printed wiring board according to the prior art. An electronic element 2 is mounted on a multilayer printed wiring board 4 according to the prior art. Each terminal 3 of the electronic element 2 is inserted into a different plated through hole A, B, C or D. Four layers of a wiring pattern 1 are printed in the board 4. When it is necessary to cut the electrical connection between one of the terminals 3, for example the terminal 3 in the plated through hole B, and the patterns 1, the cutting operation is achieved as follows. At first, the electronic element 2 is removed from the printed wiring board 4. Then the plated through hole B is broken and enlarged by a drill to cut the patterns 1 at the plated through hole B. Then the plated through holes A and C are connected discretely by a lead wire 5 (FIG. 2). Then the electronic element 2 is mounted again on the board 4 by inserting the terminals 3 into the plated through holes A, B, C, and D, respectively. As a result, the electrical connection between the terminal 3 in the plated through hole B and the patterns 1 is eliminated.

However, the above-mentioned cutting operation, especially the drilling and the connecting of the lead wire with solder, requires a great amount of time and care.

SUMMARY OF THE INVENTION

An object of the present invention is to provide a multilayer printed wiring board in which the electrical connection between a terminal of an electronic element mounted on the board and the plated through hole into which the terminal is inserted can be easily cut without removing the element from the board. A multilayer printed wiring board having a plurality of pattern layers according to the present invention has at least one pair of plated through holes comprising a first plated through hole which is directly connected to said wiring patterns and a second plated through hole to which an electronic element terminal is connected, and which is not directly connected to said wiring patterns. The first and second plated through holes are electrically connected to each other on a surface opposite an element mounting surface of the printed wiring board.

BRIEF DESCRIPTION OF THE DRAWINGS

The present invention will now be further described with reference to the accompanying drawings in which.

DETAILED DESCRIPTION OF THE EMBODIMENTS OF THE INVENTION

Figure 1:
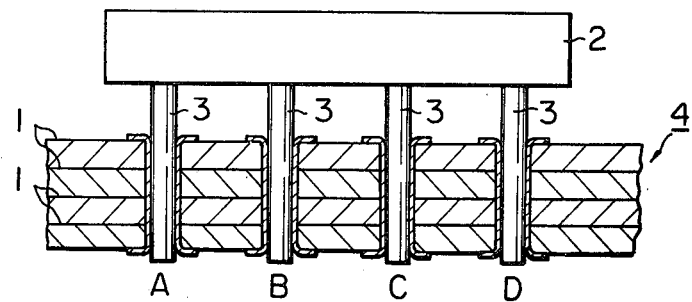
FIG. 1 is a sectional view of a multilayer printed wiring board according to the prior art.
Figure 2:
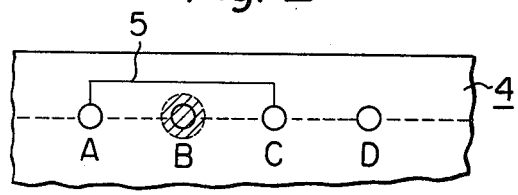
FIG. 2 is a partial plan view of a multilayer printed wiring board according to the prior art.
Figure 3:
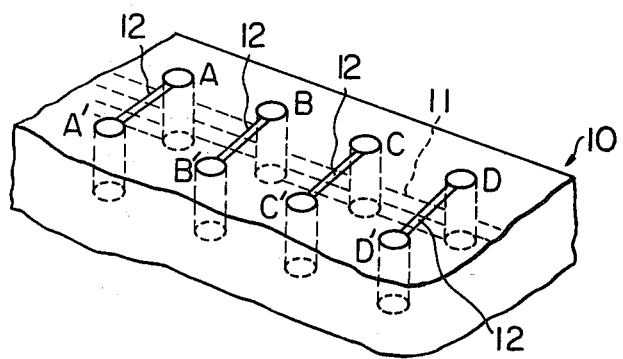
FIG. 3 is a partial perspective view of a multilayer printed wiring board according to the present invention.

FIG. 3 shows an embodiment of the present invention depicting a surface opposite an element mounting surface of a multilayer printed wiring board 10. Electronic elements are mounted on the lower surface of the printed wiring board 10 in FIG. 3. First plated through holes A, B, C and D are directly connected to wiring patterns 11. The printed wiring board 10 has second plated through holes A', B', C' and D' corresponding to the first plated through holes A, B, C and D, respectively. The terminals of an electronic element are inserted into the second plated through holes A', B', C' and D' from the lower surface of the printed wiring board 10 in FIG. 3. The second plated through holes A', B', C' and D' are not directly connected to the wiring patterns 11. Each pair of plated through holes A-A', B-B', C-C' and D-D' is electrically connected to each other by a metal foil 12 on the surface opposite the element mounting surface of the printed wiring board 10.

Figure 4:
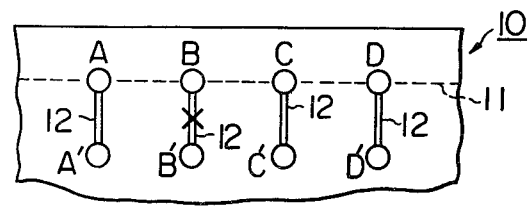
FIG. 4 is a partial plan view of a multilayer printed wiring board according to the present invention.

If it is necessary to cut the connection between the terminal which is inserted into the second plated through hole B' and the wiring patterns 11, the metal foil 12 which connects the first plated through hole B and the second plated through hole B' is cut at a point shown by a mark X in FIG. 4. In this cutting operation, there is no need to remove the electric element from the printed wiring board because the metal foil 12 is arranged on the surface opposite the element mounting surface.

Figure 5:
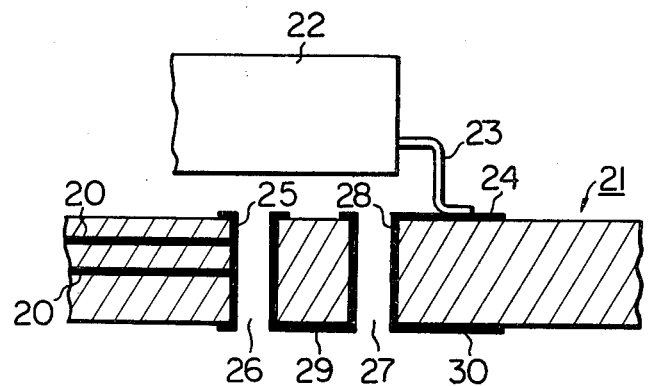
FIG. 5 is a partial sectional view of another embodiment of the present invention.

FIG. 5 shows another embodiment of the present invention. Wiring patterns 20 are printed in a multilayer printed wiring board 21. The printed wiring board 21 has a first plated through hole 26 which is directly connected to the patterns 20 by a through hole plating 25. A second plated through hole 27 which is coated on the inside by a through hole plating 28 is formed adjacent to the first plated through hole 26. A terminal 23 of an electronic element 22 is soldered on a land 24 which is electrically connected to the through hole plating 28. The first plated through hole 26 and the second plated through hole 27 are electrically connected by a metal foil 29 on the surface opposite of the element mounting surface. The second through hole 27 has an enlarged land 30 which is electrically connected to the through hole plating 28 for soldering a leading wire from or to another through hole (not shown). The land 30 may be formed integrally with the metal foil 29 as an enlarged intermediate portion of the metal foil 29, as shown in FIG. 6.

Figure 6:
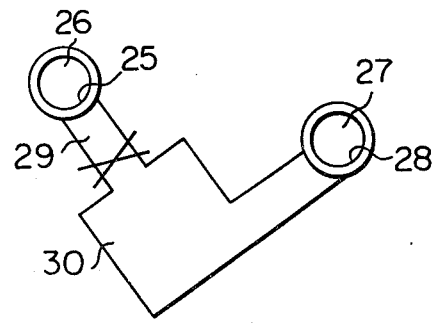
FIG. 6 is a partial plan view of another embodiment of the present invention.

If it is necessary to cut the electrical connection between the terminal 23 and the patterns 20 and to connect the terminal 23 to another through hole, the metal foil 29 is cut at a position shown by a mark X in FIG. 6, and; then, a lead wire is soldered on the land 30 to connect the through hole 27 with another desired through hole.

In FIG. 6, the land 30 is formed integrally with the metal foil 29 as an enlarged intermediate portion thereof. Thus as can be clearly seen in FIG. 6, first and second smaller portions are provided on either side of the land 30 and such portions are non-symmetrically connected to the enlarged land portion.

A benefit of this arrangement is that the non-symmetrical arrangement makes it easy for an operater to distinguish the desired portion to be cut without making an error.

In the above operation, there is no need to remove the electronic element 22 from the printed wiring board 21 because the metal foil 29 and the land 30 are arranged on the surface opposite the element mounting surface. Naturally, an electronic element of a type with a terminal which can be inserted into a through hole, can also be mounted on the printed wiring board 21 shown in FIG. 5.

As explained in the above description, if it is necessary to change a wiring pattern, the changing operation, such as cutting the electrical connection between an electronic element terminal and the wiring pattern and reconnecting the terminal to another pattern, is easily achieved in the multilayer printed wiring board according to the invention.

Plating the through hole is not the only means of electrically connecting the upper and lower surface of the printed wiring board and internal wiring patterns. Said electrical connection may be achieved by filling the hole with an electrically conductive material or by any other known method.

The invention has heretofore been described with reference to the preferred embodiments. Obviously, modifications and alterations of these embodiments can be carried out by persons skilled in the art to which this invention belongs after reading and understanding the specification. It is intended that all such modifications and alterations be included within the scope of this invention insofar as they come within the scope of the appended claims or the equivalents thereof.

What we claim is:

1. A multilayer printed wiring board having a plurality of pattern layers and at least one pair of plated through holes comprising a first plated through hole which is directly connected to said patterns and a second plated through hole to which an electronic element terminal is connected and which is not directly connected to said patterns, said first and second plated through holes being electrically connected to each other on a surface opposite an element mounting surface of the printed wiring board, wherein said first and second plated through holes are electrically connected to each other by a metal foil which has an enlarged land portion integral with said metal foil for soldering a lead wire, a first smaller portion connecting said first plated through hole and said enlarged land portion, and a second smaller portion connecting said second plated through hole and said enlarged land portion, said first and second smaller portions being non-symmetrically connected to said enlarged land portion.

* * * * *